United States Patent [19]

Richard

[11] 4,266,286
[45] May 5, 1981

[54] ARRANGEMENT FOR EXTRACTION AND RECEIVING DATA FOR A REFRESHABLE MEMORY

[75] Inventor: André Richard, Paris, France

[73] Assignee: Compagnie Internationale Pour L'Informatique CII-Honeywell Bull, Paris, France

[21] Appl. No.: 92,562

[22] Filed: Nov. 8, 1979

[30] Foreign Application Priority Data

Nov. 22, 1978 [FR] France .................................. 78 32933

[51] Int. Cl.$^3$ ............................ G11C 7/06; G11C 7/00
[52] U.S. Cl. ..................................... 365/205; 365/222
[58] Field of Search ........................ 365/149, 205, 222

[56] References Cited

U.S. PATENT DOCUMENTS

| | | | |
|---|---|---|---|
| 3,806,898 | 4/1974 | Askin | 365/222 |
| 4,110,841 | 8/1978 | Schroeder | 365/205 |

FOREIGN PATENT DOCUMENTS 2731442  1/1978  Fed. Rep. of Germany ........... 365/205

Primary Examiner—Stuart N. Hecker
Attorney, Agent, or Firm—Kerkam, Stowell, Kondracki & Clarke

[57] ABSTRACT

A memory of the MOS N channel type comprising two half-memories each containing the same number of columns, each column being bisected at the center by a refreshing amplifier. A bus is alotted to each half-memory and is connectable to any half-column in the half-memory which is addressed so as to read and rewrite in the refreshing phase. The extracting and rewriting arrangement incorporates a flip-flop having its inputs connected to the buses by a differential circuit and its outputs connected to inputs of a read and rewrite circuit. The buses are initialized at a low potential and a reference potential is applied to one bus when the other bus is connected to a half-column. Transient interference rise on the selected bus above the disturbance threshold of the refreshing amplifier is prevented.

11 Claims, 4 Drawing Figures

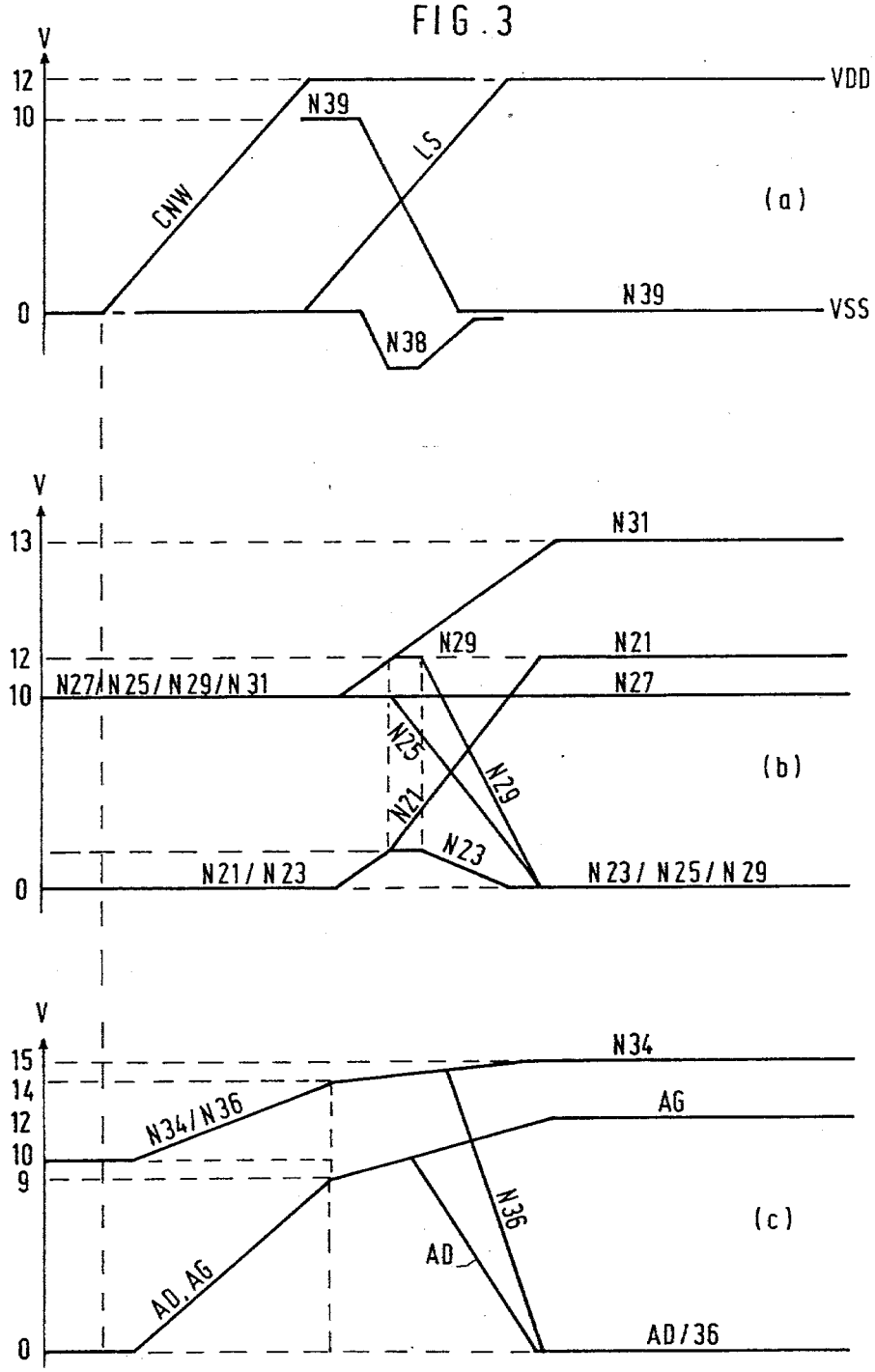

ARRANGEMENT FOR EXTRACTION AND RECEIVING DATA FOR A REFRESHABLE MEMORY

BACKGROUND OF THE INVENTION

1. Field of the Invention

The present invention relates to memories in which data can be refreshed such, for example, as memories which use "volatile" storage cells of the MOS type (Metal, Oxide, Semiconductor) in which the levels of electrical charge, by an agreed convention, represent the "0" and "1" values of the binary digits which they store.

The invention relates more particularly to those memories of this kind which are, a priori, divided into two half-memories having equal data capacities, each half-memory containing the same number of columns having the same digit capacities. Each column is bisected at the center by a refreshing amplifier and the digit storing cells can be connected to the resulting half-columns for writing, reading (followed by rewriting) and refreshing.

2. Description of the Prior Art

In a memory of this kind, a pair of buses for reading (followed by rewriting since the reading process destroys the data read) is situated between two half-memories. Each bus can be connected to the columns of the half-memory by means of an equal number of addressable switch elements. All connections are made on one side of the refreshing amplifier. Thus, any connection between one of the buses and a column is made by connecting the bus concerned to one of the half-columns.

SUMMARY OF THE INVENTION

An arrangement for extracting and rewriting data is connected between the buses. It has its own activation phases to read and then rewrite the data bit, since the extraction upsets the half-column which is connected, which data bit which is then recorded in the storage cell which is connected to the half-column.

The invention has as an object to provide an arrangement of this kind such that it satisfies all the requirements necessary if it is to be possible for extraction and then rewriting to take place in any cell currently being refreshed before the end of the refreshing phase, with no risk of losing the data. These requirements will be explained below, in particular with reference to the general diagram shown in the accompanying FIG. 1.

In brief, an arrangement for extracting and then rewriting data in a memory organized in the manner summarized above is characterized in that it comprises, in combination, a flip-flop having its actuating inputs connected to the buses by a differential circuit and an activation input which receives the voltage of a read/rewrite control phase, a reading and rewriting circuit having its input connected to the outputs of the said flip-flop and outputs connected to the buses, means for initializing the buses at the low potential reached by a half-column in its refreshing phase, means for applying a reference potential to one of the buses when the other bus is connected to a half-column and means which prevent the bus connected to a half-column from rising temporarily to a potential higher than a disturbance threshold for the refreshing amplifier.

BRIEF DESCRIPTION OF THE DRAWINGS

In order to describe the invention in detail, reference will be made to the accompanying Figures which show a particular embodiment of the invention from which may be deduced all the technological modifications which can be used to carry out the invention.

FIG. 3 shows groups of waveforms illustrating the changes in potential at various points in the circuits of FIG. 2.

DESCRIPTION OF THE PREFERRED EMBODIMENTS

In the illustrated embodiment, all the circuit components are assumed to be MOS components having N type channels integrated into either an insulating substrate or P type semiconductor substrate which is raised to a potential equal to or less than the low potential VSS of a supply whose high potential is VDD. VSS may be 0 volts and VDD 12 volts.

Figure 1:
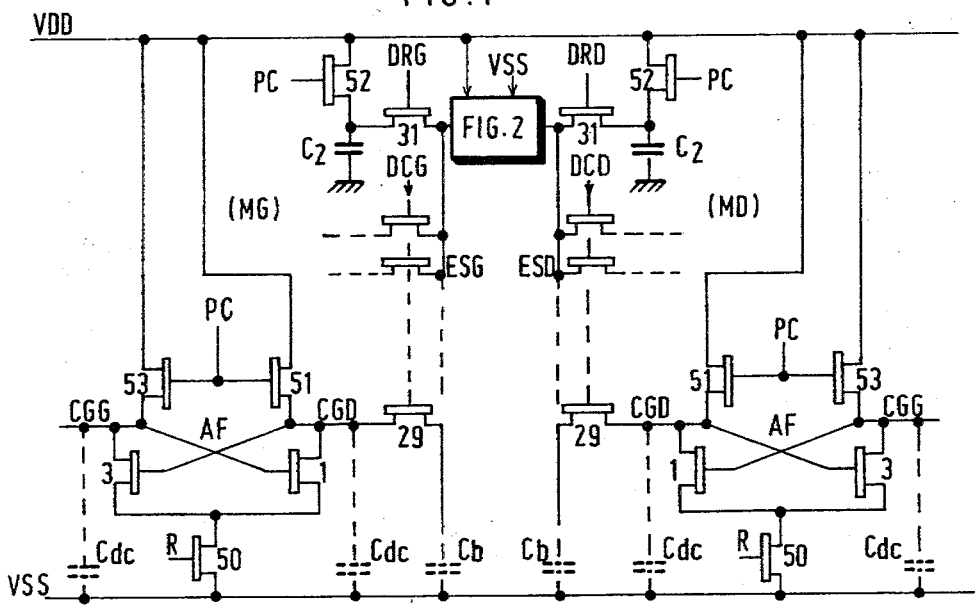
FIG. 1 is a partial diagram, sufficient to explain the context of the invention and certain of its characteristic features, of the layout of a refreshable memory which incorporates an arrangement for extracting and rewriting data formed in accordance with the present invention.

Referring to FIG. 1, the read/rewrite buses allotted to the half-memories MG and MD are marked ESG and ESD. These buses are each represented by a capacitance Cb (at VSS). Bus ESG can be connected by switches 29 to the columns of half-memory MG. Bus ESD can similarly be connected by switches 29 to the columns of half-memories MD. Only one column is shown for each of the half-memories in FIG. 1, other columns being diagrammatically indicated by phantom lines, it being understood that additional columns would include like elements as shown in connection with the illustrated column. The gates of the switches 29 are actuated at DCG in the case of half-memory MG and at DCD in the case of half-memory MD by the outputs of conventional column address decoders (not shown).

Each column is "bisected" at the center by a refreshing amplifier AF and because of this the switch 29 has its "drain" connected to a half-column CGD, which is represented by its intrinsic capacitance Cdc which is of the order of one-twelfth of the capacitance Cb of a bus, for example. It can only reach the other half-column CGG via one of the crossed connections of the said refreshing amplifier AF. Column CGG has the same capacitance Cdc as column CGD.

The refreshing amplifier AF is shown in a known form. It comprises a pair of transistors 1 and 3 which are cross-connected from drain to gate. The sources of transistors 1 and 3 are connected in common to a source of current formed by a transistor 50 whose source is at a low potential, such as VSS for example. This transistor is only unblocked in a refreshing phase R when the voltage of the phase is applied to its gate. It will be appreciated that, as usual, the storage cells of the columns which are to be refreshed are connected in succession to the half-columns only during this phase R when their charges are compared to those of a refreshable cell.

There is no need for the refreshing mechanism nor the reading, writing and rewriting mechanism to be described in detail since these mechanisms in themselves are well known and outside the scope of the invention. However, it should be noted that when the refreshing phase R rises, before the half-columns have been charged to potential VDD by a precharging phase PC to initialize them, the two half-columns drop by unequal amounts. One of the half-columns comes down to VSS, whereas the other stops at an intermediate level which is below VDD, but close to the level reached at the time of writing or rewriting.

The initialization or enabling of the columns at potential VDD is achieved by virtue of the fact that the phase PC unblocks switches 51 and 53 which then connect the two half-columns to voltage VDD. The phase PC drops again before the digit storing cells are connected to the columns and before phase R rises. It has charged the capacitance Cdc of the columns by an amount close, for example, to 0.5 picofarad whereas the capacitance Cb of the buses are close to 6 picofarads, for example.

To save time, it is desired to extract data before the end of the refreshing phase and thus before the cells to be refreshed are disconnected from the columns. Thus, if the read/write bus was at a high potential at the time when a switch 29 connected it to a column whose half-column CGD was at the low potential VSS, then this half-column would rise to a level close to the potential of the bus and, by actuating transistor 3 of the refreshing amplifier AF, would discharge the left-hand half-column CGG through the transistor. The charge in any storage cell which was connected to CGG would be irretrievably altered.

Figure 2:
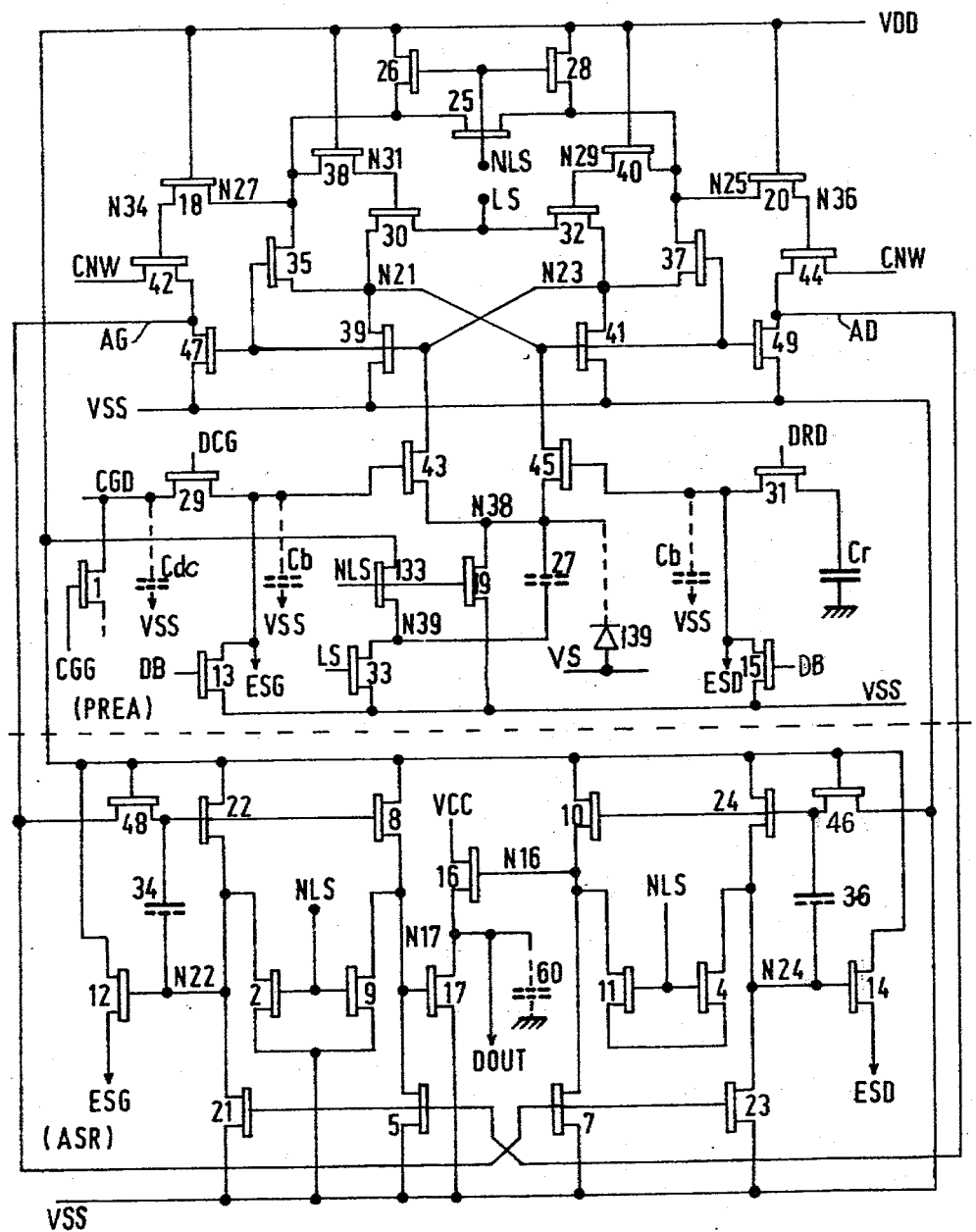
FIG. 2 shows a typical embodiment of the part of this arrangement which connects the buses of the two half-memories.

To overcome this disadvantage the invention, in accordance with one of its features, makes provision for initializing or enabling the buses at the low voltage VSS, which is that of any lowest half-column at the end of a refreshing, prior to any activation of the extraction and rewriting controlling arrangement. This is achieved, as shown in FIG. 2, by connecting voltage VSS to the buses ESG and ESD, through switches 13 and 15. Switches 13 and 15 are unblocked by an initialization phase DB which discharges the capacitance Cb to the low level in question, this phase ending before a bus is connected to a half-column.

It is also advisable that in periods when the phase LS is beginning, that one of the buses which is connected to a half-column initially at potential VSS should not be able to experience an interference rise in potential beyond a threshold VT, which is the conduction threshold of transistor 3. The means for inhibiting this transient interference rise will be described below.

The arrangement according to the invention is permanently connected between the buses and incorporates a flip-flop to whose inputs are connected a differential circuit connected to the said buses. When one of the buses is connected to a half-column, such a circuit needs to receive a reference potential at its other input. Thus, in accordance with another feature of the invention, since this reference potential needs to be that of the other bus, a capacitance Cr, of a value which is for example equal to half the capacitance Cdc of a half-column is precharged, for example once again by the same phase PC which precharged the columns of the half-memories. When one of the switches 29 is unblocked, a bus is thus connected to a column addressed at DCG or DCD. Another switch 31 is unblocked either by DRD or by DRG (a command coming from a half-memory addressed to the decoder which is not shown) to connect this "reference" capacitance Cr to the other bus. A difference, whose sign depends on the initial potential on the half-column connected, is thus created between the potentials applied to the differential input preamplifier circuit (PREA) for actuating the flip-flop, shown in FIG. 2. This enables the flip-flop to set itself in accordance with the actual potential on the half-column to which the bus selected is connected. This flip-flop, by setting itself, determines the states of its outputs AG and AD which outputs are connected to suitable control inputs of the output and rewriting amplifier ASR.

In the embodiment illustrated in FIG. 2, it is assumed that the column address decoder has designated a switch 29 which connects the bus ESG, which is initialized at VSS, to the half-column CGD of the left-hand half-memory MG. It is therefore switch 31 actuated by DRD which connects the precharged capacitance, Cr to the bus ESD which is not selected. For ease of switching, two identical capacitances Cr which have been precharged to identical levels through switches 52 which are rendered conductive by phase PC, are provided in the present embodiment (a single reference capacitor would be adequate which would be switched to ESG or ESD as circumstances dictated).

The flip-flop of the preamplifier is formed essentially by four transistors 30, 32 and 39, 41. Transistors 30 and 32 have their drains connected to the terminal to which the operating phase voltage LS is applied, and their sources connected to the gates of transistors 39 and 41 by crossed connections, points N21 and N23. The sources of transistors 39 and 41 are connected to the low supply voltage VSS, their drains of transistors 39 and 41 are connected to the gates of transistors 30 and 32, respectively, lines N31 and N29, by uncrossed connections through linking transistors 35 and 38 from transistor 39 to transistor 30, and linking transistors 37 and 40 from transistor 41 to transistor 32.

Transistor 35 has its gate connected to point N23, its source connected to point N21 and its drain connected to point N27 which, via transistor 18 whose gate is connected to the high voltage, is connected to the line N34 to which the gate of transistor 42 is connected. Transistor 37 has its gate connected to line N21, its source connected to line N23 and its drain connected to line N25 which, via a transistor 20 whose gate is connected to the high voltage, is connected to line N36 to which the gate of transistor 44 is connected.

The output AG of the flip-flop is taken from a point between the transistor 42 and a transistor 47 whose source is connected to voltage VSS and whose gate is connected to point N23. The output AD of the flip-flop is taken from a point between transistor 44 and a transistor 49 whose source is connected to voltage VSS and whose gate is connected to point N21. Points AG and AD are charged at the same time by a voltage CNW via transistor 42 and 44. Voltage CNW rises before the phase voltage LS, see waveform (a) in FIGS. 3 and 4. AD and AG both rise, see waveform (c) in FIG. 3. Point AG or point AD is then discharged through 47 or 49 depending upon whether it is point N23 or point N21 which rises when the flip-flop is set, while the gate of 42 or the gate of 44 is discharged via transistor 18 or transistor 20 and transistor 35 or transistor 37; this depending on the position of the flip-flop. In the example illustrated by waveforms (b) and (c) in FIG. 3, it is AG which continues to rise while AD drops again. Points N21 and N23 had begun by rising together and then N23 dropped back to VSS after holding steady whereas N21 then rose to VDD. As soon as the difference in potential between N21 and N23 exceeded the conduction threshold of transistor 37, point N25 began to discharge through 37, taking points N29 and N36 with it via the channels through transistors 40 and 20. Point N27 remained at its initial potential while N31 and N34 rose by a "bootstrap" effect due to the gate/drain and gate/source capacitances of transistors 30 and 42 respectively.

The changes would be the opposite if the flip-flop was set to the other position.

At the time of the non-phase voltage NLS, whose variations in level are opposite from those of the phase voltage LS, transistors 26 and 28 had charged points N27 and N25 to a potential VDD, less their conduction threshold VT (VT equals 2 volts in the waveform diagrams described above). Furthermore, the transistor 25 is operated by NLS to be briefly conducting each time LS ends (fails to rise) and thus rapidly to equalize the potentials at these points, one of which dropped in the course of applying LS to the flip-flop.

It should be understood that the values of the components making up each pair involved in the formation of the circuits of the arrangement are identical except when stated otherwise. In the quiescent state, the flip-flop and its ancillaries are in a perfectly balanced stable state which favors neither one balance position nor the other.

The input circuit to the flip-flop is differential. Point N23 is connected to the output of the transistor 43 and point N21 to that of a transistor 45. The gates of these transistors are connected to buses ESG and ESD, respectively, and their sources are connected in common to a point N38. This point is initialized to VSS by a transistor which is conductive in the non-phase period NLS. It is also connected to a point N39 between two transistors 133 and 33 which are operated by NLS and LS, respectively, via a capacitor 27. Furthermore, point N38 is coupled to the substrate which is at a potential VS less VSS. This coupling is represented here by a diode 139, it being assumed that the substrate is semiconductive. The coupling may be capacitive if the said substrate were an insulator and had a metal coating at voltage VS. Transistor 33 has its source connected to VSS and transistor 133 has its drain connected to VDD. During LNS, capacitor 27 is thus charged between VDD-VT and VSS. When LS rises and NLS falls, a charge travels through transistor 33 and capacitor 27 and is divided between points N21 and N23 under the control of the potentials on buses ESG and ESD the difference between which determines the direction of changeover, since, as described, a reference is established on the bus which is not selected by connecting capacitance Cr. The point N39 which was at VDD-VT, waveform (a) in FIG. 3, drops to VSS and then transistor 133 blocks. Point N38 drops from VSS to the potential of the substrate, and transistors 43 and 45 are thus conductive in a region of steep descent, which accelerates the changeover in the direction defined by the direction of the difference in potential between the buses.

Phase CNW rises almost at the same time as switches 29 and 31 are operated. Thus, in a first stage, outputs AD and AG of the flip-flop rise simultaneously whereas points N27 and N25 remain high and points N21 and N23 low. It is only when LS subsequently rises while the flip-flop is setting itself that the gate of one of transistors 42 and 44, points N34 and N36, discharges through channels 18 and 35, respectively, 20 and 37, depending upon the division of the charge which is transferred by transistor 33 to points N21 and N23 via transistors 43 and 45 while, by the same token, output AG or AD is returned to potential VSS by transistor 47 or transistor 49 depending upon the direction of changeover. The other output AD or AG continues to rise towards VDD; see the details of the changes in the potentials at the various points which are shown in the waveform diagrams of FIG. 3 and the explanation which has been given.

As stated, the direction of changeover is defined by the difference between the potentials on bus ESG, which is the one selected in the example used, and bus ESD, which is the one not selected in the example and which is thus raised to a reference potential defined by the ratio between capacitances Cr and Cb. If, when the bus ESG is connected to half-column CGD, the said half-column is at a low potential VSS, the direction of changeover is such that output AG drops back whereas output AD continues to rise towards VDD. If, on the other hand, the half-column were at a potential higher than the above-mentioned potential VSS, output AG will continue to rise and output AD will drop back since the reference lies between the two potential values which the connected bus is able to assume.

Outputs AD and AG of the flip-flop are connected to inputs of an output and rewrite circuits ASR. This circuit comprises, firstly, a push-pull circuit consisting of two transistors 16 and 17 from which is taken the output DOUT which gives the data read. The circuits which receive this data are not shown since they are outside the scope of the invention. They are simply represented by the load capacitance 60 which they present to output DOUT. This push-pull output circuit is connected between voltage VSS and a voltage VCC which is less than VDD and which defines the required level of output signals for the receiving circuits.

Output DOUT is able to assume one or other of two levels depending upon how the push-pull circuit is actuated, the said circuit being actuated by the relative potentials at points N16 and N17 which are connected to the gates of transistors 16 and 17, respectively. Point N17 is connected to a push-pull circuit formed by two transistors 8 and 5. The gate of a transistor 5 is connected to output AD of the flip-flop and the gate of transistor 8 to output AG via a transistor 48 whose gate is connected to VDD. Similarly point N16 is connected to a push-pull circuit formed by two transistors 7 and 10. The gate of transistor 7 is connected to output AG of the flip-flop and the gate of transistor 10 to output AD, via a transistor 46 whose gate is connected to voltage VDD.

Circuit ASR also contains two follower transistor 12 and 14 which are respectively connected to bus ESG and bus ESD to apply to the buses the appropriate potentials for rewriting. Follower transistor 12 has its gate operated by the potential at a point N22 which is connected to a push-pull circuit formed by two transistors 21 and 22. Transistor 22 is actuated by output AG of the flip-flop and transistor 21 by output AD. The actuation of follower transistor 14 is complimentary, being performed from point N24 of a push-pull circuit formed by two transistors 23 and 24. Transistor 23 is operated by the potential of AG and transistor 24 by the potential of AD.

In the quiescent state, the four transistors 16, 17, 12 and 14 are blocked since NSL holds their gates at VSS via transistors 11, 9, 2 and 4, respectively.

Capacitors 34 and 36 are connected between the drains of transistors 48 and 46 respectively and points N22 and N24. When, at the beginning of the LS phase, the potentials at both outputs AD and AG of the flip-flop rise as explained above, they charge the capacitors 36 and 34. Points N17 and N16 rise to unspecified potentials. Points N24 and N22 on the other hand, in accordance with a feature of the invention, are not able transitorily to exceed the potential VSS plus VT which would upset the updating amplifier connected to one of the buses and would be liable to unblock transistor 3 in amplifier AF at the wrong time. For this purpose, the transistors making up each pair 21 and 22, and 23 and 24 have different characteristics and the ratio of the characteristics between 21 and 22 on the one hand and between 23 and 24 on the other limits the potentials N22 and N24 to a value which is then inadequate to unblock the followers 12 and 14. There is no transient interference current to ESG or ESD (as the case may be).

When it is the potential of AG which drops back, in the case where ESG is connected to a half-column, it blocks transistors 7 and 23, which releases points N16 and N24 which rise to VDD while the discharge of the gates of transistors 8 and 22 allows points N17 and N22 to drop to VSS. Bus ESG is held low by transistors 1 and 50 (which are then conductive). As it rises, point N24 takes with it the gates of transistors 24 and 10 to a point above the level of potential VDD because of the preliminary charge from capacitor 36. Follower 14 is unblocked and the unconnected bus ESD rises.

In the opposite case, where AD drops back, transistors 5 and 21 block, which releases points N17 and N22 which rise to VDD and the gate of 22 rises above VDD by virtue of capacitor 34. The discharge of the gates of transistor 10 and 24 allows points N16 and N24 to drop to VSS. Capacitor 36 discharges and ESD is held low at the reference potential which was established when the charges were divided between Cr and Cb. Follower 12 is unblocked and causes ESG to rise and ESG takes with it the half-column to which it is connected, via switch 29 (whose gate is connected to VDD), up to the potential level for rewriting in this column.

Figure 4:
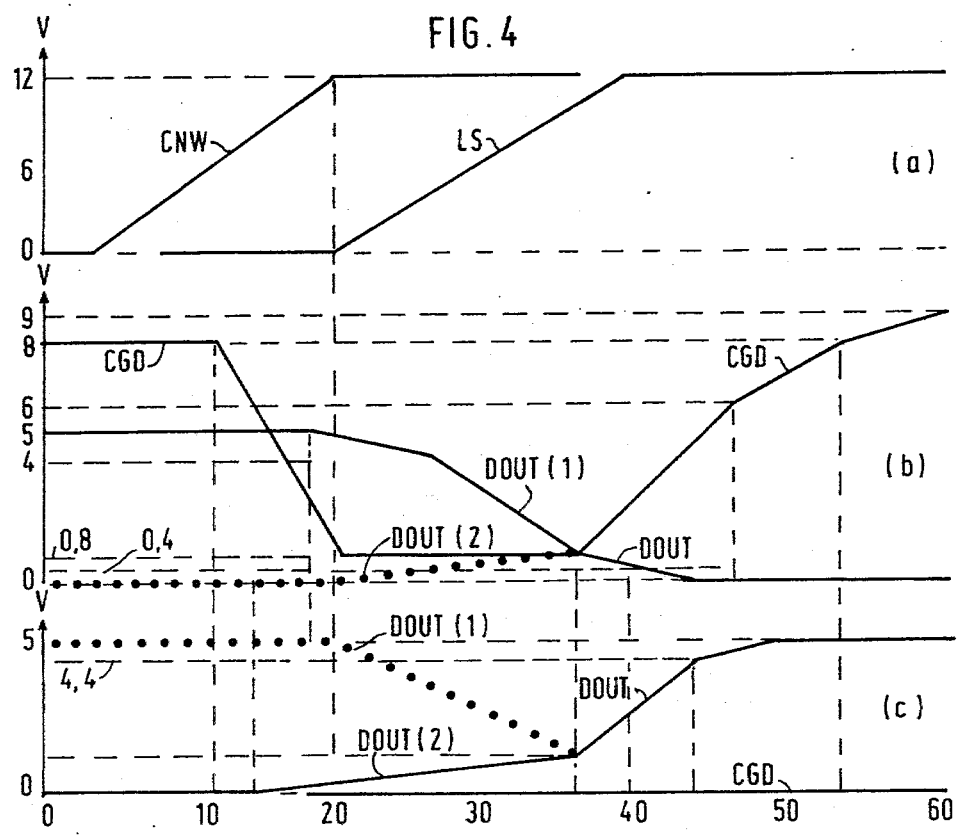
FIG. 4 shows a group of waveforms relating to the changes in potential at other points in the arrangement of FIG. 2.

In the two waveform diagrams (b) and (c) in FIG. 4 are shown the various changes in the output DOUT depending upon whether the half-column CGD connected to the bus was high or at VSS and, in each case, depending upon the initial state of output DOUT:

DOUT (1): initialized at the high level DCC;
DOUT (2): initialized at the low level VSS.

The final level of output DOUT does not depend on its initial state.

When CGD is initially high, waveform diagram (b), CGD drops when it is connected to ESG as a result of the division of charge between Cdc and Cb. Output DOUT (1) drops and output DOUT (2) rises to an intermediate level and then DOUT drops towards VSS, which it reaches once the flip-flop has been set. CGD then rises again to the high level while DOUT remains at the low level.

When CGD is initially low and remains low, waveform diagram (c), at the beginning voltages DOUT (1) and DOUT (2) make the same changes as above-mentioned up to the intermediate level. After this, output DOUT rises to level VCC which is assumed in the present case to be 5 volts.

I claim:

1. In a circuit arrangement for extracting and rewriting data for a refreshable memory divided into two half-memories each containing the same number of columns, each column being divided by a refreshing amplifier into two half-columns whose potentials become unequal whenever there is a refreshing operation, the memory having a pair of read/rewrite buses, each bus being connectable by an addressable switch to one of the half-columns of any column in one of the half-memories, the arrangement being connected between these buses by read input and rewrite outputs, the improvement comprising means for initializing said buses to the lower of the said unequal potentials, means for raising one of said buses to a reference potential when the other bus is connected to a half-column, means for setting up a read signal when the reference read/rewrite phase potential rises, and means for applying the read signal to the rewrite output which is connected to the bus connected to the half-column, said means for applying the read signal being adapted to prevent any transient variation in potential at the rewrite outputs which might erase the data in store.

2. In a circuit arrangement according to claim 1 wherein the said means for setting up the read signal comprises a flip-flop having actuating inputs connected to the buses by a differential circuit adapted to be activated upon the rise in the read/rewrite phase potential.

3. In a circuit arrangement according to claim 2, wherein the differential circuit comprises transistors having conductive states defined by the potentials of the buses to which their gates are connected, said transistors having a common source which is initialized to a high potential and connected to a precharged capacitor and having their drains connected to the activating inputs of the flip-flop, and means which respond to the rise in the reference phase potential to discharge the said capacitor through the said source, the charge in said capacitor being divided at the activating inputs of the flip-flop depending upon the direction of the difference between the potentials on the buses which are applied to the gates of said transistors, the said division in turn determining the setting of the flip-flop.

4. In a circuit arrangement according to claim 3, including means for coupling said common source to a substrate whose potential is lower than the low supply potential so as to drop to this lower potential when the phase potential rises and to bring said transistors in the differential circuit into their region of steep gradient.

5. A circuit arrangement according to claim 3, wherein said flip-flop incorporates two pairs of transistors reciprocally paired with their opposite numbers by crossed connections between the transistors forming a first pair and the transistors forming the second pair and uncrossed return connections between the transistors forming the second pair and those of the first pair, the activating inputs of said flip-flop being connected to the crossed connections, the outputs of said flip-flop being taken from the said uncrossed return connections, the sources of the transistors forming the first pair being connected to an input for the application of the read/rewrite phase voltage, and means which raise the connections of the said uncrossed connections from which the output of the flip-flops are taken to the high supply voltage.

6. A circuit arrangement according to claim 1 wherein the means for initializing the potential of the buses consists of switches arranged to discharge the capacitance of the buses to the said potential prior to the rise in the read/rewrite phase potential.

7. A circuit arrangement according to claim 1 wherein the means to raise the unconnected bus to the said reference potential comprises switch means for connecting said bus to a precharged capacitor prior to the rise in the read/rewrite phase potential.

8. A circuit arrangement according to claim 2 including means for connecting the outputs of the flip-flop to control inputs of a circuit having follower means circuit for following the changes in the potentials at the said outputs.

9. A circuit arrangement according to claim 8 wherein follower circuits for rewriting includes a transistor push-pull circuit associated with each output connected and that the transistors are controlled by opposing outputs of the flip-flops and having a common point connected to the transistor inserted in one of the buses, the relative characteristics of the transistors in the said push-pull circuit being such that the common point does not assume a potential which unblocks the transistor inserted in the bus once a potential difference which represents the extracted data without ambiguity has been reached between the outputs of the flip-flop, the control connections of the push-pull circuits in the rewrite followers being reversed from one of the circuits to the other.

10. A circuit arrangement according to claim 9 wherein said flip-flop incorporates means to precharge its outputs with a voltage whose rise anticipates that of the read/rewrite phase voltage, means to discharge one of these outputs and to complete the charge of the other when the said phase voltage rises and as a function of the position of the flop-flop, and said follower circuit means includes means to charge, in response to this precharge, capacitances which shunt one of the sections of each of the push-pull circuits and means which respond to the additional charge at an output of the flip-flop to unblock the follower circuit of which the said section is controlled by the said output.

11. A circuit arrangement according to claim 8 wherein the follower circuit means connected to the outputs of the flip-flop includes, connected to a read output, a pair of push-pull circuits which are reciprocally controlled with the outputs of the flip-flop and a third push-pull circuit which is controlled by the variations in potential at the common points of the circuits forming the said pair.

* * * * *